United States Patent
Sakai et al.

(10) Patent No.: US 8,690,298 B2
(45) Date of Patent: Apr. 8, 2014

(54) LIQUID-EJECTING HEAD, LIQUID-EJECTING APPARATUS, AND PIEZOELECTRIC ELEMENT AND PIEZOELECTRIC MATERIAL

(75) Inventors: Tomohiro Sakai, Chino (JP); Satoshi Kimura, Fujimi-machi (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 13/044,499

(22) Filed: Mar. 9, 2011

(65) Prior Publication Data

US 2011/0221828 A1    Sep. 15, 2011

(30) Foreign Application Priority Data

Mar. 10, 2010    (JP) .................. 2010-053825

(51) Int. Cl.
  *B41J 2/045* (2006.01)
  *H01L 41/00* (2013.01)
  *H02N 2/00* (2006.01)

(52) U.S. Cl.
  USPC ............................................. 347/68; 310/311

(58) Field of Classification Search
  None
  See application file for complete search history.

(56) References Cited

U.S. PATENT DOCUMENTS

| 7,786,656 B2 | 8/2010 | Sakashita et al. | |
| 2007/0216264 A1* | 9/2007 | Furukawa et al. | 310/366 |
| 2009/0020726 A1 | 1/2009 | Uraki et al. | |
| 2011/0037810 A1* | 2/2011 | Wang | 347/68 |

FOREIGN PATENT DOCUMENTS

| CN | 101295762 A | 10/2008 |
| CN | 101389580 A | 3/2009 |
| JP | 11-129474 A | 5/1999 |
| JP | 2004077304 A * | 3/2004 |

* cited by examiner

*Primary Examiner* — Matthew Luu
*Assistant Examiner* — Erica Lin
(74) *Attorney, Agent, or Firm* — Kilpatrick Townsend & Stockton LLP (57) ABSTRACT

A liquid-ejecting head comprises a pressure-generating chamber and a piezoelectric element including a piezoelectric material. The piezoelectric material contains a complex oxide having a perovskite structure. The complex oxide contains bismuth, sodium, barium, titanium, and copper. The ratio of copper to the total amount of titanium and copper is 0.35 mol % or more and 0.70 mol % or less.

4 Claims, 5 Drawing Sheets

LIQUID-EJECTING HEAD, LIQUID-EJECTING APPARATUS, AND PIEZOELECTRIC ELEMENT AND PIEZOELECTRIC MATERIAL

CROSS-REFERENCE TO RELATED APPLICATIONS

This application claims the benefit of priority to Japanese Patent Application No. 2010-053825 filed Mar. 10, 2010, the contents of which are hereby incorporated by reference in their entirety.

BACKGROUND

1. Technical Field

The present invention relates to a liquid-ejecting head and a liquid-ejecting apparatus each including a piezoelectric element for altering the internal pressure of a pressure-generating chamber in communication with a nozzle opening. The invention also relates to the piezoelectric element and a piezoelectric material.

2. Related Art

One representative example of liquid-ejecting heads installed in liquid-ejecting apparatuses is an ink jet recording head. The ink jet recording head has a diaphragm as part of a pressure-generating chamber. The pressure-generating chamber communicates with a nozzle opening through which ink droplets are ejected. The diaphragm is deformed by the action of a piezoelectric element to pressurize ink in the pressure-generating chamber, causing ink droplets to be ejected through the nozzle opening. Examples of the piezoelectric element installed in the ink jet recording head include longitudinal vibration piezoelectric elements and flexural vibration piezoelectric elements. A certain piezoelectric element of the longitudinal vibration mode is manufactured by fixing a piezoelectric-element-forming member (a piezoelectric diaphragm) to a fixed substrate and cutting the piezoelectric-element-forming member in a comb-like shape with a wire saw. The piezoelectric-element-forming member includes a common internal electrode and individual internal electrodes stacked with a piezoelectric material interposed therebetween (see, for example, JP-A-11-129474).

The piezoelectric material used for such a piezoelectric element requires excellent piezoelectric characteristics (a large strain). One representative example of the piezoelectric material is lead zirconate titanate (PZT).

In recent years, however, from an environmental point of view, there has been a demand for piezoelectric materials of low lead content. Thus, various piezoelectric materials having an $ABO_3$ perovskite structure have been proposed as lead-free piezoelectric materials.

However, lead-free piezoelectric materials produce a smaller strain than PZT. Thus, there is a demand for piezoelectric materials that can produce a large strain and have excellent piezoelectric characteristics.

Such problems exist not only in ink jet recording heads but also in liquid-ejecting heads for ejecting liquid other than ink.

SUMMARY

An advantage of some aspects of the invention is that it provides a liquid-ejecting head and a liquid-ejecting apparatus each having a low environmental load and excellent piezoelectric characteristics, as well as a piezoelectric element and a piezoelectric material.

In accordance with an aspect of the invention to solve the problems described above, a liquid-ejecting head includes a pressure-generating chamber in communication with a nozzle opening for ejecting liquid and a piezoelectric element including a piezoelectric material layer and an electrode layer disposed on the piezoelectric material layer, the piezoelectric material layer containing a complex oxide having a perovskite structure, wherein the complex oxide contains bismuth, sodium, barium, titanium, and copper, and the ratio of copper to the total amount of titanium and copper is 0.35% by mole or more and 0.70% by mole or less.

In accordance with this aspect, the piezoelectric element can produce a large strain, reduce the environmental load, and have excellent piezoelectric characteristics. Furthermore, since the piezoelectric material layer can be formed by firing at a relatively low temperature, the material of the electrode layer can be selected from a variety of materials.

In accordance with another aspect of the invention, a liquid-ejecting apparatus includes a liquid-ejecting head according to the aspect described above.

In accordance with this aspect, the liquid-ejecting apparatus can achieve high print quality.

Preferably, the liquid-ejecting apparatus includes two or more of the liquid-ejecting heads. This allows the liquid-ejecting apparatus to eject different liquids.

In accordance with still another aspect of the invention, a piezoelectric element includes a piezoelectric material layer containing a complex oxide having a perovskite structure and an electrode disposed on the piezoelectric material layer, wherein the complex oxide contains bismuth, sodium, barium, titanium, and copper, and the ratio of copper to the total amount of titanium and copper is 0.35% by mole or more and 0.70% by mole or less.

In accordance with this aspect, the piezoelectric element can produce a large strain, reduce the environmental load, and have excellent piezoelectric characteristics. Furthermore, since the complex oxide can be crystallized at low temperature to form the piezoelectric material layer, the material of the electrode layer can be selected from a variety of materials.

In accordance with still another aspect of the invention, a piezoelectric material contains a complex oxide having a perovskite structure, wherein the complex oxide contains bismuth, sodium, barium, titanium, and copper, and the ratio of copper to the total amount of titanium and copper is 0.35% by mole or more and 0.70% by mole or less.

This aspect allows the formation of a piezoelectric layer that can produce a large strain. The piezoelectric layer thus formed can reduce the environmental load and have excellent piezoelectric characteristics.

BRIEF DESCRIPTION OF THE DRAWINGS

The invention will be described with reference to the accompanying drawings, wherein like numbers reference like elements.

DESCRIPTION OF EXEMPLARY EMBODIMENTS

The invention is described in detail in the following embodiments.

First Embodiment

Figure 1:
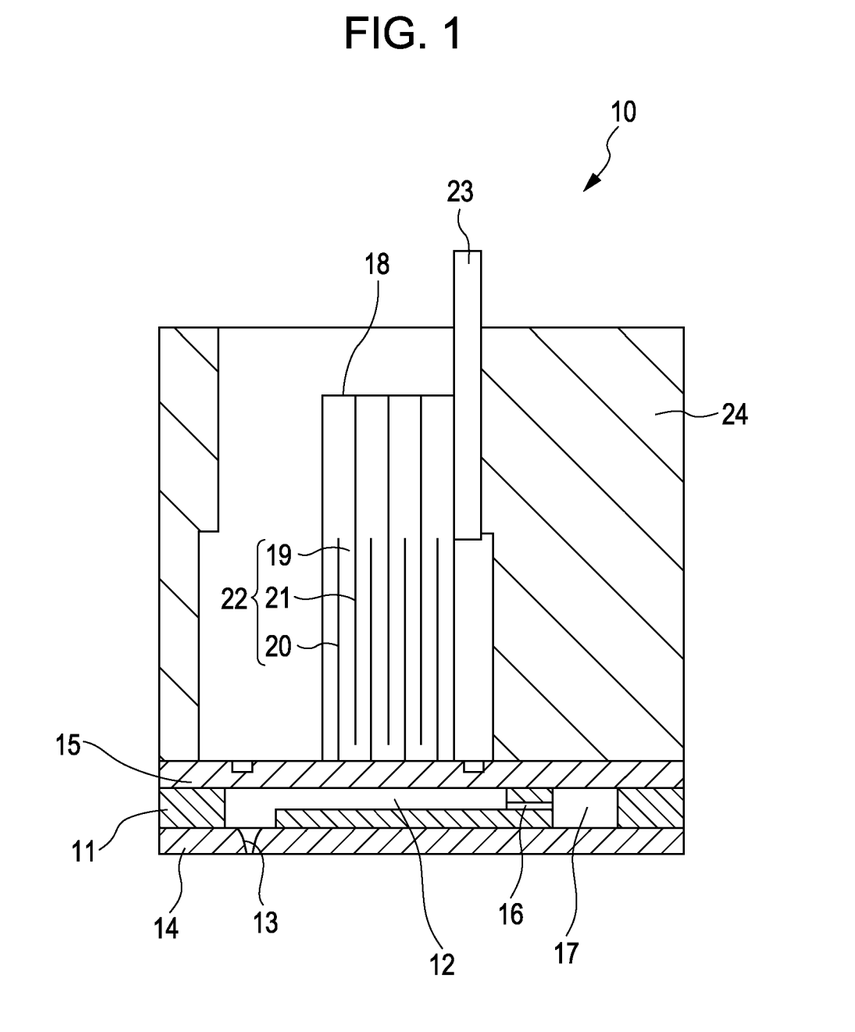
FIG. 1 is a cross-sectional view of a recording head according to a first embodiment of the invention.

FIG. 1 is a cross-sectional view of an ink jet recording head as an example of a liquid-ejecting head according to a first embodiment of the invention.

An ink jet recording head 10 illustrated in FIG. 1 includes a longitudinal vibration piezoelectric element. A flow passage substrate 11 includes a plurality of pressure-generating chambers 12 juxtaposed to each other. The flow passage substrate 11 is disposed between a nozzle plate 14 and a diaphragm 15. The nozzle plate 14 includes nozzle openings 13 each corresponding to one of the pressure-generating chambers 12. The flow passage substrate 11 includes a reservoir 17, which communicates with each of the pressure-generating chambers 12 through an ink supply port 16 and serves as a common ink chamber for the pressure-generating chambers 12. The reservoir 17 is connected to an ink cartridge (not shown). The ink jet recording head 10 further includes a piezoelectric element unit and a head case 24 fixed on the diaphragm 15. The piezoelectric element unit includes piezoelectric elements 18 disposed on the diaphragm 15. Each of the piezoelectric elements 18 corresponds to one of the pressure-generating chambers 12. The head case 24 houses the piezoelectric element unit.

As described above, a surface of the diaphragm 15 opposite the pressure-generating chambers 12 abuts against one end of each of the piezoelectric elements 18 corresponding to one of the pressure-generating chambers 12. In the present embodiment, the piezoelectric elements 18 are formed in an integrated manner in the piezoelectric element unit. More specifically, piezoelectric material layers 19 and electrode layers 20 and 21 are disposed vertically on the diaphragm 15 and are alternately stacked to form a piezoelectric-element-forming member 22. The piezoelectric-element-forming member 22 is cut in a comb-like shape such that each tooth of the comb corresponds to one of the pressure-generating chambers 12, forming each of the piezoelectric elements 18. Thus, in the present embodiment, the piezoelectric elements 18 are formed in an integrated manner. An inactive region not contributing to the vibration of the piezoelectric elements 18 (the piezoelectric-element-forming member 22), that is, the base end of the piezoelectric elements 18 is fixed to a fixed substrate 23. A circuit board (not shown) having wiring for supplying signals to drive each of the piezoelectric elements 18 is connected to a surface of the piezoelectric elements 18 opposite the fixed substrate 23 in the vicinity of the base end of the piezoelectric elements 18. The piezoelectric elements 18 function as piezoelectric actuators for deforming the diaphragm 15. The piezoelectric elements 18 and the fixed substrate 23 constitute the piezoelectric element unit.

The piezoelectric material layers 19 are formed of a complex oxide having a perovskite structure represented by the general formula $ABO_3$. This complex oxide contains bismuth, sodium, barium, titanium, and copper. The ratio of copper to the total amount of titanium and copper is 0.35% by mole or more and 0.70% by mole or less. The inclusion of bismuth, barium, sodium, titanium, and the predetermined amount of copper can increase the strain of the piezoelectric material layers 19 and improve the piezoelectric constant (d33) as compared with, for example, copper-free (Bi, Na, Ba)$TiO_3$ described below in the examples. Furthermore, the strain can be increased without a marked increase in tan$\delta$. In other words, the inclusion of the predetermined amount of copper allows the piezoelectric material layers 19 to produce a large strain without a marked increase in tan$\delta$. A percentage of copper higher than 0.70% by mole results in a strain smaller than the strain produced by piezoelectric material layers formed of the complex oxide (Bi, Na, Ba)$TiO_3$.

The percentages of bismuth, sodium, and barium in the complex oxide are not particularly limited. For example, the ratio of sodium to the total amount of bismuth, sodium, and barium is preferably 41.0% by mole or more and 49.0% by mole or less, and the ratio of barium to the total amount of bismuth, sodium, and barium is preferably 1.0% by mole or more and 15.0% by mole or less.

A complex oxide according to the present embodiment may contain bismuth, sodium, and barium at the A sites and titanium and copper at the B sites of the perovskite structure. More specifically, the ratio of the total moles of bismuth, sodium, and barium to the total moles of titanium and copper may range from 0.8 to 1.5, for example, 1. The ratio of the total moles of bismuth, sodium, and barium to the total moles of titanium and copper can be optimized to control the number of oxygen defects in the perovskite structure, improving crystallinity and piezoelectric characteristics.

In the ink jet recording head 10, ink is supplied to the reservoir 17 through an ink passage in communication with the ink cartridge and is distributed to each of the pressure-generating chambers 12 through the ink supply port 16. In practice, the application of a voltage to the piezoelectric element 18 contracts the piezoelectric element 18. The contraction of the piezoelectric element 18 deforms (pulls up) the diaphragm 15 to increase the volume of the pressure-generating chamber 12, thereby leading ink into the pressure-generating chamber 12. After the space up to the nozzle opening 13 has been filled with ink, the removal of a voltage applied to the electrode layers 20 and 21 of the piezoelectric element 18 in response to a recording signal sent from the drive circuit extends the piezoelectric element 18 to its original state. Concurrently, the diaphragm 15 is also deformed and restored to its original state. This contracts the pressure-generating chamber 12 and increases the internal pressure of the pressure-generating chamber 12, causing ink droplets to be ejected through the nozzle opening 13. Thus, in the present embodiment, the longitudinal vibration piezoelectric elements 18 function as pressure-generating means for causing a pressure change in the pressure-generating chambers 12.

The piezoelectric material layers 19 formed of the complex oxide described above can produce a large strain and have excellent piezoelectric characteristics. Thus, the piezoelectric elements 18 including the piezoelectric material layers 19 have excellent piezoelectric characteristics and can produce a large piezoelectric strain at a low driving voltage. Furthermore, the piezoelectric material layers 19 formed of the non-lead piezoelectric material as described above can reduce the environmental load.

Since the piezoelectric material layers 19 can be formed by firing at a relatively low temperature, the materials of the electrode layers can be selected from a variety of materials. More specifically, materials having a relatively low melting temperature can be selected as the materials of the electrode layers 20 and 21.

Furthermore, since copper used in the piezoelectric material layers 19 is inexpensive and easy to handle, the piezoelectric elements 18 having excellent piezoelectric characteristics can be easily produced at low cost.

Furthermore, the piezoelectric elements 18 in the present embodiment can be produced at a low poling voltage and a short poling time. The term "poling" in the production of the piezoelectric elements 18 refers to the treatment that unidirectionally applies an electric field to the piezoelectric material layers 19 containing randomly polarized crystals to make the direction of polarization moment uniform. Poling can significantly reduce variations in the displacement of the piezoelectric elements 18 at the time of actual use. For example, poling can be satisfactorily performed by applying an electric field of 3 kV/mm to the piezoelectric elements 18 for five minutes. Since the piezoelectric elements 18 in the present embodiment can be produced at a low poling voltage and a short poling time, the cost required for the operation of a drive circuit in poling can be reduced.

One example of a method for manufacturing the piezoelectric element 18 will be described below.

First, powders of metals, such as bismuth, sodium, barium, titanium, and copper or powders of metallic compounds containing these metals are weighed as starting materials for the piezoelectric material layers 19 at an intended component ratio. The powders are weighed such that the ratio of copper to the total amount of titanium and copper in the product is 0.35% by mole or more and 0.70% by mole or less. Examples of metals or metallic compounds containing bismuth include bismuth, bismuth oxide, and bismuth hydroxide. Examples of metallic compounds containing sodium include sodium carbonate, sodium hydrogen carbonate, and sodium hydroxide. Examples of metals or metallic compounds containing barium include barium, barium oxide, and barium carbonate. Examples of metals or metallic compounds containing titanium include titanium and titanium oxide. Examples of metals or metallic compounds containing copper include copper and copper oxide. Furthermore, for example, metallic compounds containing bismuth, sodium, barium, titanium, and/or copper, such as sodium bismuth titanate, bismuth titanate, sodium bismuthate, and barium titanate, may also be used.

Pure water or a liquid that is more volatile than pure water, such as alcohol, is added to the powders weighed. The powders are then ground in a pulverizer, such as a ball mill, and are dried to produce a mixed powder. The time of pulverization is not particularly limited. For example, the powders are ground in a ball mill at 100 rpm for 24 hours.

The mixed powder is allowed to react in an electric furnace at a temperature in the range of 750° C. to 950° C. for 1 to 10 hours to produce a calcined powder (a calcination process).

The calcined powder is then ground in a mortar. The calcined powder ground is mixed with pure water or a liquid that is more volatile than pure water, such as alcohol, and is ground in a pulverizer, such as a ball mill, for example, for one hour.

The resulting calcined powder is then mixed with, for example, predetermined amounts of binder, solvent, dispersant, and plasticizer to produce slurry. The slurry is applied to a film and is dried to produce a calcined sheet. An electrode material is applied in a certain pattern to the calcined sheet, for example, by screen printing and is dried. A plurality of these sheets are stacked and pressed to produce a laminate, which is formed of the material of the piezoelectric material layers 19 and the materials of the electrode layers 20 and 21.

The laminate is then heated to 650° C. in 20 hours in an electric furnace and is held at this temperature for two hours for degreasing (a degreasing process). The laminate is then heated to a temperature in the range of 1000° C. to 1200° C. at 100° C./h and is fired for 2 to 50 hours (a firing process), forming the piezoelectric material layers 19 and the electrode layers 20 and 21. In general, the firing temperature of a sodium bismuth titanate piezoelectric material is relatively high. The addition of copper, however, can lower the firing temperature. More specifically, the inclusion of copper in the piezoelectric material layers 19 can lower the sintering temperature by approximately 100° C. to 200° C. A decrease in firing temperature can provide various alternatives to the material of the electrode layers 20 and 21. For example, an electrode material mainly composed of nickel, silver, and palladium can be used. Furthermore, a decrease in firing temperature can reduce energy required for firing and consequently reduce manufacturing costs. After the laminate is cut in a predetermined shape, an electrode material paste and other materials are applied to a predetermined end face of the piezoelectric material layers 19 and are baked at a predetermined temperature, forming the piezoelectric-element-forming member 22.

Finally, an electric field is unidirectionally applied to the piezoelectric element 18 to make the direction of polarization moment uniform (poling). For example, poling can be satisfactorily performed by applying an electric field of 3 kV/mm to the piezoelectric elements 18 for five minutes.

Although the present embodiment describes the longitudinal vibration piezoelectric element 18 in which the piezoelectric material layers 19 and the electrode layers 20 and 21 are alternately stacked and expand and contract in the longitudinal direction, the invention can be applied to a flexural vibration piezoelectric element in which a first electrode, a piezoelectric material layer, and a second electrode are sequentially stacked on a substrate (a flow-passage-forming substrate).

The piezoelectric material layers may be formed by a known thin film method, such as a sputtering method, a sol-gel process, or a metal-organic deposition (MOD) method.

The invention will be further described in the following examples. In the examples, a piezoelectric element composed of a first electrode, a piezoelectric material, and a second electrode was fabricated. However, the invention is not limited to these examples.

EXAMPLE 1

Starting materials for a piezoelectric material layer, bismuth trioxide ($Bi_2O_3$), sodium carbonate ($Na_2CO_3$), titanium dioxide ($TiO_2$), barium carbonate ($BaCO_3$), and copper (II) oxide (CuO), were weighed at a predetermined component ratio. Ethanol was added to the starting materials. The mixture was ground in a planetary ball mill for 20 minutes and was dried to produce a mixed powder. The mixed powder was fired in an air atmosphere at 850° C. for two hours to produce a calcined powder. The calcined powder was ground in a mortar. After ethanol was added to the calcined powder, the calcined powder was ground in a planetary ball mill for 40 minutes and was dried. Poly(vinyl alcohol) was added to the resulting powder, which was then mixed in a mortar. The powder was formed into pellets having a diameter of 1 cm and a thickness of 1 mm with a press molding machine. The pellets of the calcined powder were heated to 650° C. in two hours, were held at this temperature for two hours for degreasing, and were fired at 1000° C. for two hours, forming a piezoelectric material layer formed of a $ABO_3$ complex oxide represented by the following general formula (I), wherein x=0.4650, y=0.0630, and z=0.0035.

$$(Bi_{1-x-y},Na_x,Ba_y)(Ti_{1-z},Cu_z)O_3 \quad (1)$$

The top and bottom surfaces of the piezoelectric material layer thus formed were polished. A silver paste was applied to the polished surfaces by printing and was fired at 700° C. for 20 minutes to form an electrode layer on the top and bottom surfaces of the piezoelectric material layer, thus forming a piezoelectric element.

While the piezoelectric element was immersed in silicone oil at 25° C., an electric field of 3 kV/mm was applied to the piezoelectric element for five minutes to perform poling of the piezoelectric element. Thus, a piezoelectric element according to Example 1 was fabricated.

EXAMPLES 2 TO 4 AND COMPARATIVE EXAMPLE 1

A piezoelectric element was fabricated in the same manner as in Example 1 except that the component ratio of bismuth trioxide, sodium carbonate, titanium dioxide, barium carbonate, and copper (II) oxide was altered to form a piezoelectric material layer formed of an $ABO_3$ complex oxide represented by the general formula (I) wherein x, y, and z were listed in Table 1.

REFERENCE EXAMPLE 1

A piezoelectric element was fabricated in the same manner as Example 1 except that copper (II) oxide was not used, the component ratio of bismuth trioxide, sodium carbonate, titanium dioxide, and barium carbonate was altered such that x and y were as listed in Table 1, and the firing was performed at 1200° C.

TEST EXAMPLE 1

Figure 3:
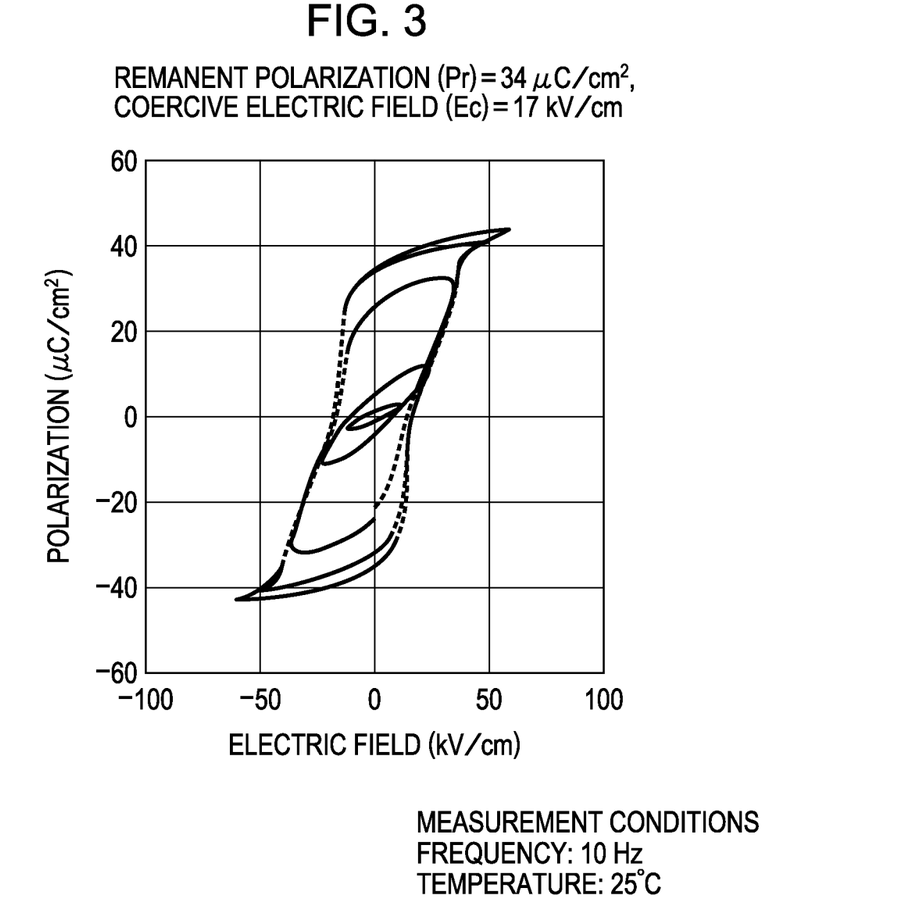
FIG. 3 is a graph showing P-E curves for Example 3.
Figure 4:
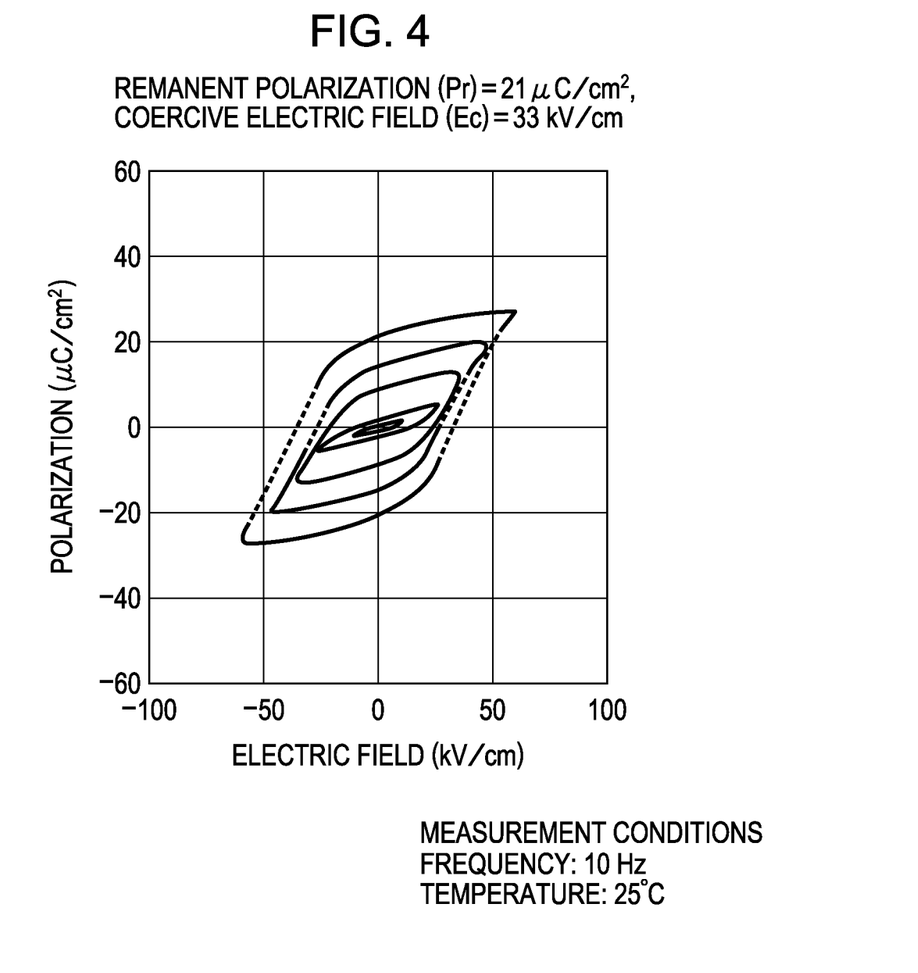
FIG. 4 is a graph showing P-E curves for Reference Example 1.

The piezoelectric constant (d33), the relative dielectric constant ($\epsilon r$), and the tan$\delta$ of the piezoelectric elements according to Examples, Comparative Example 1, and Reference Example 1 after poling were measured with a d33 meter (manufactured by Piezotest). Table 1 and FIGS. 2 to 4 show the results.

TABLE 1

| | x | y | z | d33 (pC/N) | tan$\delta$ | $\epsilon r$ | Firing temp. (° C.) |
|---|---|---|---|---|---|---|---|
| Reference example 1 | 0.4700 | 0.0600 | 0.0000 | 142 | 0.040 | 735 | 1200 |
| Example 1 | 0.4650 | 0.0630 | 0.0035 | 168 | 0.024 | 695 | 1000 |
| Example 2 | 0.4550 | 0.0810 | 0.0045 | 178 | 0.033 | 1158 | 1000 |
| Example 3 | 0.4600 | 0.0680 | 0.0060 | 212 | 0.043 | 1266 | 1000 |
| Example 4 | 0.4650 | 0.0560 | 0.0070 | 161 | 0.035 | 750 | 1000 |
| Comparative example 1 | 0.4550 | 0.0720 | 0.0090 | 75 | 0.058 | 1529 | 1000 |

Figure 2:
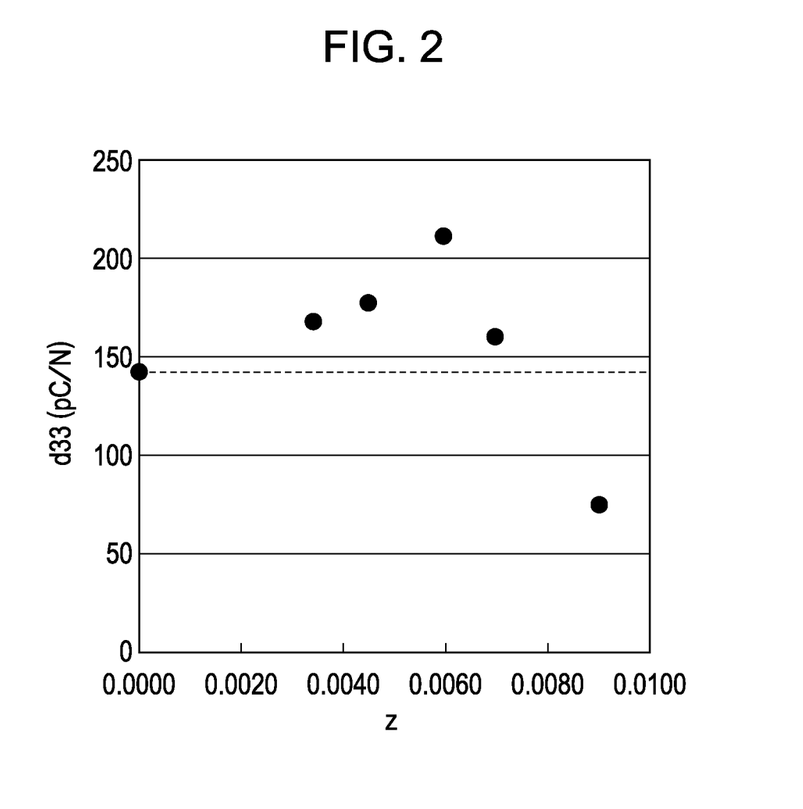
FIG. 2 is a graph showing the results for Test Example 1.

As shown in Table 1 and FIG. 2, the piezoelectric elements according to Examples 1 to 4, in which z was in the range of $0.0035 \leq z \leq 0.0070$, that is, the ratio of copper to the total amount of titanium and copper ranges from 0.35% by mole to 0.70% by mole, have piezoelectric constants (d33) in the range of 161 to 212 (pC/N), which were higher than the piezoelectric constant of the copper-free piezoelectric element according to Reference Example 1. In the piezoelectric elements according to Examples 1 to 4 and Comparative Example 1, which contained 0.35% by mole or more copper, the sintering temperature of the piezoelectric substance could be 1000° C., which was lower by 200° C. than the sintering temperature of the piezoelectric substance in the copper-free piezoelectric element according to Reference Example 1. The piezoelectric elements according to Examples 2 to 4 had a higher relative dielectric constant than the piezoelectric element according to Reference Example 1.

The piezoelectric constant (piezoelectric strain constant) d is expressed by $Si = d_{ij} \times E_i$, wherein S denotes strain, E denotes an electric field, i denotes the strain direction, and j denotes the voltage direction. The strain of a piezoelectric film increases with the piezoelectric constant d. The piezoelectric constant d33 represents a piezoelectric strain constant when the application of an electric field E3 causes a strain S3 in the direction parallel to the electric field E3. The piezoelectric constant d31 represents a piezoelectric strain constant when the application of an electric field E3 causes a strain S1 in the direction perpendicular to the electric field E3. The suffixes "1", "2", and "3" denote x-, y-, and z-axis directions, respectively.

Since the piezoelectric elements according to Examples 1 to 4 have high piezoelectric constants d33, it is presumed that these piezoelectric elements also have high piezoelectric constants d31.

These results show that a piezoelectric element can produce a large strain and have excellent piezoelectric characteristics in the case where a piezoelectric material layer is formed of a complex oxide having a perovskite structure represented by the general formula $ABO_3$, the complex oxide contains bismuth, sodium, barium, titanium, and copper, and the ratio of copper to the total amount of titanium and copper is 0.35% by mole or more and 0.70% by mole or less.

TEST EXAMPLE 2

The relationship between polarization (P) and electric field (E) for the piezoelectric elements according to Example 3 and Reference Example 1 was determined by the application of a triangular wave at 25° C. at a frequency of 10 Hz with a ferroelectric test system "FCE-1A" manufactured by Toyo Co. FIGS. 3 and 4 show the results for Example 3 and Reference Example 1, respectively.

As shown in FIGS. 3 and 4, the piezoelectric elements according to Example 3 and Reference Example 1 had hysteresis loops characteristic of a ferroelectric substance. This proves that the piezoelectric elements according to Example 3 and Reference Example 1 are ferroelectric substances.

At an electric field of 60 kV/cm, the piezoelectric element according to Example 3 had a coercive electric field Ec of 17 kV/cm and a remanent polarization Pr of 34 $\mu C/cm^2$, and the piezoelectric element according to Reference Example 1 had a coercive electric field Ec of 33 kV/cm and a remanent polarization Pr of 21 $\mu C/cm^2$. Thus, it was found that the piezoelectric element according to Example 3 had a larger remanent polarization than the piezoelectric element according to Reference Example 1, had excellent ferroelectricity, and was suitable for the miniaturization of the piezoelectric element. It was also found that the piezoelectric element according to Example 3 had excellent piezoelectric characteristics.

It was also found that the piezoelectric element according to Example 3 had a smaller coercive electric field than the piezoelectric element according to Reference Example 1 and could therefore be produced at a low poling voltage and a short poling time.

Figure 5:
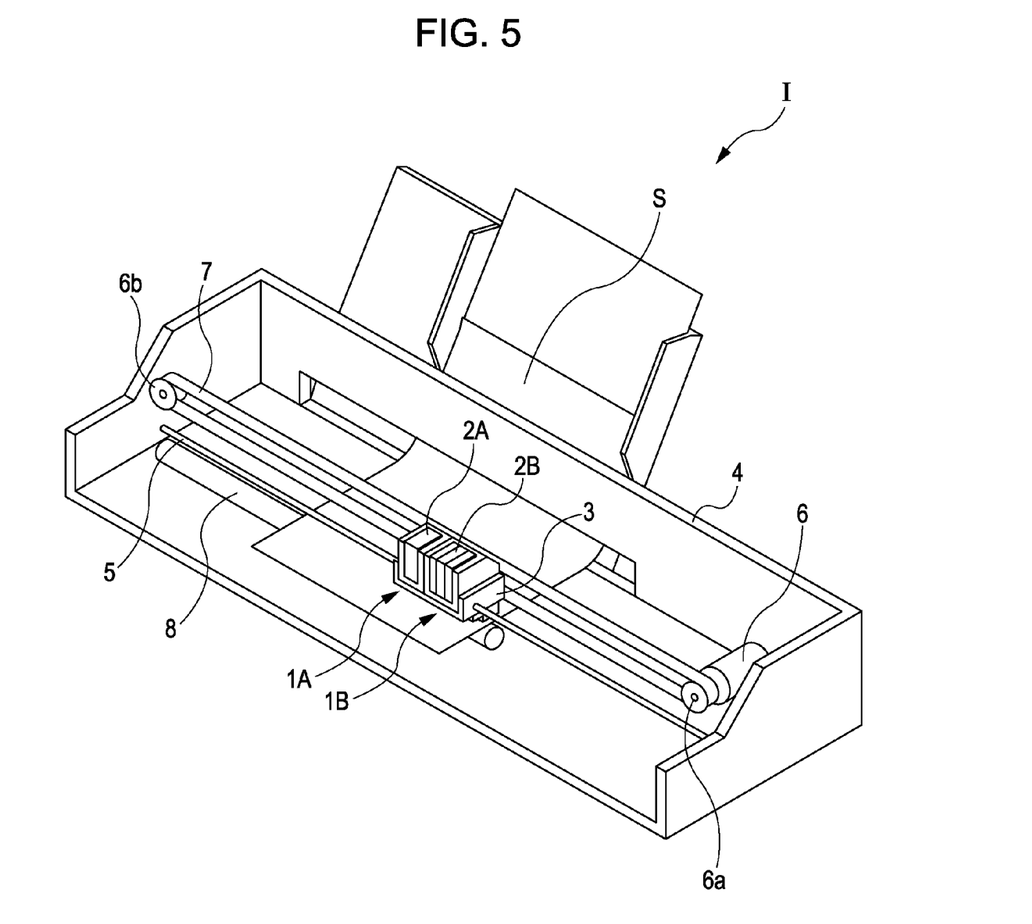
FIG. 5 is a schematic perspective view of a recording apparatus according to the first embodiment of the invention.

The ink jet recording head 10 described above can be installed in ink jet recording apparatuses as one component of a recording head unit that includes an ink path in communication with an ink cartridge. FIG. 5 is a schematic view of an ink jet recording apparatus according to an embodiment of the invention.

A liquid-ejecting apparatus according to the present embodiment is an ink jet recording apparatus I, for example. As illustrated in FIG. 5, recording head units 1A and 1B include an ink jet recording head described in detail below and house removable ink cartridges 2A and 2B. The ink cartridges 2A and 2B constitute an ink supply unit for supplying ink to the ink jet recording head. The recording head units 1A and 1B are mounted on a carriage 3, which is mounted on a carriage shaft 5 attached to a main body 4 of the recording apparatus. The carriage 3 can move in the axial direction. The recording head units 1A and 1B can eject a black ink composition and a color ink composition, respectively.

A drive motor 6 is disposed in the vicinity of an end of the carriage shaft 5. A first pulley 6a having a groove around the perimeter is disposed at the tip of the shaft of the drive motor 6. A second pulley 6b corresponding to the first pulley 6a of the drive motor 6 is rotatably disposed in the vicinity of the other end of the carriage shaft 5. A timing belt 7 formed of an elastic loop, such as a rubber loop, runs between the first pulley 6a and the second pulley 6b.

When the driving force of the drive motor 6 is transferred to the carriage 3 via the timing belt 7, the carriage 3 including the recording head units 1A and 1B moves along the carriage shaft 5. The main body 4 includes a platen 8 along the carriage 3. The platen 8 can rotate by the driving force of a paper feed motor (not shown). The recording sheet S, such as a paper sheet, can be fed by a feed roller (not shown) and transported over the platen 8.

Although each of the ink jet recording head units 1A and 1B includes one ink jet recording head in FIG. 5, one ink jet recording head unit 1A or 1B may include two or more of the ink jet recording heads 10.

Other Embodiments

While the embodiments of the invention are described above, the basic features of the invention are not limited to these embodiments. Although the ink jet recording head 10 (head units 1A and 1B) mounted on the carriage 3 moves in the main scanning direction in the ink jet recording apparatus I described above, the invention may also be applied to line recording apparatuses in which printing is performed by transporting a recording sheet S, such as a paper sheet, in a sub-scanning direction while an ink jet recording head is fixed.

While the ink jet recording head has been described as an example of a liquid-ejecting head in the first embodiment, the invention is directed to a wide variety of general liquid-ejecting heads and, as a matter of course, can be applied to liquid-ejecting heads for ejecting liquid other than ink. Examples of other liquid-ejecting heads include recording heads for use in image recording apparatuses, such as printers, coloring-material-ejecting heads for use in the manufacture of color filters for liquid crystal displays, electrode-material-ejecting heads for use in the formation of electrodes for organic EL displays and field-emission displays (FED), and bioorganic-compound-ejecting heads for use in the manufacture of biochips.

Since a piezoelectric material according to an aspect of the invention has excellent piezoelectric characteristics, the piezoelectric material can be used in piezoelectric elements of liquid-ejecting heads, such as ink jet recording heads, as described above. A piezoelectric material according to an aspect of the invention can also be used in other applications, for example, ultrasonic devices, such as ultrasonic transmitters, ultrasonic motors, various sensors, such as infrared sensors, ultrasonic sensors, thermal sensors, pressure sensors, and pyroelectric sensors, and piezoelectric elements, such as piezoelectric transducers. The invention can also be applied to ferroelectric elements, such as ferroelectric memories.

What is claimed is:

1. A liquid-ejecting head comprising:
   a pressure-generating chamber communicating with a nozzle opening; and
   a piezoelectric element comprising a piezoelectric material layer and an electrode layer, the piezoelectric material layer comprising a complex oxide having a perovskite structure,
   wherein the complex oxide comprises bismuth, sodium, barium, titanium, and copper,
   wherein the ratio of copper to the total amount of titanium and copper is 0.35 mol% or more and 0.70 mol % or less,
   and wherein the piezoelectric element has a piezoelectric constant (d33) higher than 142 pC/N, and tan$\delta$ of the piezoelectric element is under 0.043.

2. A liquid-ejecting apparatus comprising at least one liquid-ejecting head according to claim 1.

3. A piezoelectric element comprising a complex oxide having a perovskite structure, wherein the complex oxide comprises bismuth, sodium, barium, titanium, and copper, and the ratio of copper to the total amount of titanium and copper is 0.35 mol % or more and 0.70 mol % or less.

4. The piezoelectric element of claim 3, wherein the piezoelectric element has a piezoelectric constant (d33) higher than 142 pC/N, and tan$\delta$ of the piezoelectric element is under 0.043.

* * * * *